(12) United States Patent
Chuang et al.

(10) Patent No.: US 11,114,489 B2
(45) Date of Patent: Sep. 7, 2021

(54) BACK-ILLUMINATED SENSOR AND A METHOD OF MANUFACTURING A SENSOR

(71) Applicants: KLA-Tencor Corporation, Milpitas, CA (US); Hamamatsu Photonics K.K., Hamamatsu (JP)

(72) Inventors: Yung-Ho Alex Chuang, Cupertino, CA (US); Jingjing Zhang, San Jose, CA (US); John Fielden, Los Altos, CA (US); David L. Brown, Los Gatos, CA (US); Masaharu Muramatsu, Hamamatsu (JP); Yasuhito Yoneta, Hamamatsu (JP); Shinya Otsuka, Hamamatsu (JP)

(73) Assignees: KLA-Tencor Corporation, Milpitas, CA (US); Hamamatsu Photonics K.K., Shizuoka (JP)

( * ) Notice: Subject to any disclaimer, the term of this patent is extended or adjusted under 35 U.S.C. 154(b) by 124 days.

(21) Appl. No.: 16/421,212

(22) Filed: May 23, 2019

(65) Prior Publication Data
US 2019/0386054 A1 Dec. 19, 2019

Related U.S. Application Data

(60) Provisional application No. 62/686,667, filed on Jun. 18, 2018.

(51) Int. Cl.
*H01L 27/146* (2006.01)
(52) U.S. Cl.
CPC .... *H01L 27/14636* (2013.01); *H01L 27/1462* (2013.01); *H01L 27/14665* (2013.01)
(58) Field of Classification Search
CPC ............. H01L 27/1462; H01L 27/1464; H01L 27/14643
See application file for complete search history.

(56) References Cited

U.S. PATENT DOCUMENTS

| 3,755,704 A | 8/1973 | Spindt et al. |
| 3,870,917 A | 3/1975 | Cuny |

(Continued)

FOREIGN PATENT DOCUMENTS

| EP | 0602983 A1 | 6/1994 |
| EP | 0746871 A1 | 12/1996 |

(Continued)

OTHER PUBLICATIONS

U.S. Appl. No. 61/720,700—Certified Copy corres to PCT/EP2013/071080, pp. 1-44.

(Continued)

*Primary Examiner* — Mark V Prenty
(74) *Attorney, Agent, or Firm* — Bever, Hoffman & Harms, LLP

(57) ABSTRACT

An image sensor for electrons or short-wavelength light includes a semiconductor membrane, circuit elements formed on one surface of the semiconductor membrane, and a pure boron layer on the other surface of the semiconductor membrane. The circuit elements are connected by metal interconnects comprising a refractory metal. An anti-reflection or protective layer may be formed on top of the pure boron layer. This image sensor has high efficiency and good stability even under continuous use at high flux for multiple years. The image sensor may be fabricated using CCD (charge coupled device) or CMOS (complementary metal oxide semiconductor) technology. The image sensor may be a two-dimensional area sensor, or a one-dimensional array sensor.

18 Claims, 7 Drawing Sheets

(56) References Cited

U.S. PATENT DOCUMENTS

| | | |
|---|---|---|
| 3,947,707 A | 3/1976 | Shannon et al. |
| 4,099,198 A | 7/1978 | Howorth et al. |
| 4,210,922 A | 7/1980 | Shannon |
| 4,275,326 A | 6/1981 | Houtkamp |
| 4,348,690 A | 9/1982 | Jastrzebski et al. |
| 4,467,189 A | 8/1984 | Tsuchiya |
| 4,555,731 A | 11/1985 | Zinchuk |
| 4,644,221 A | 2/1987 | Gutierrez et al. |
| 4,760,031 A | 7/1988 | Janesick |
| 4,853,595 A | 8/1989 | Alfano et al. |
| 5,054,683 A | 10/1991 | Haisma et al. |
| 5,120,949 A | 6/1992 | Tomasetti |
| 5,144,630 A | 9/1992 | Lin |
| 5,227,313 A | 7/1993 | Gluck et al. |
| 5,315,126 A | 5/1994 | Field |
| 5,376,810 A | 12/1994 | Hoenk et al. |
| 5,428,392 A | 6/1995 | Castro et al. |
| 5,563,702 A | 10/1996 | Emery et al. |
| 5,717,518 A | 2/1998 | Shafer et al. |
| 5,719,069 A | 2/1998 | Sparks |
| 5,731,584 A | 3/1998 | Beyne et al. |
| 5,742,626 A | 4/1998 | Mead et al. |
| 5,760,809 A | 6/1998 | Malhotra et al. |
| 5,760,899 A | 6/1998 | Eismann |
| 5,852,322 A | 12/1998 | Speckbacher |
| 5,940,685 A | 8/1999 | Loomis et al. |
| 5,999,310 A | 12/1999 | Shafer et al. |
| 6,013,399 A | 1/2000 | Nguyen |
| 6,064,759 A | 5/2000 | Buckley et al. |
| 6,162,707 A | 12/2000 | Dinh et al. |
| 6,201,257 B1 | 3/2001 | Stettner et al. |
| 6,201,601 B1 | 3/2001 | Vaez-Iravani et al. |
| 6,220,914 B1 | 4/2001 | Lee et al. |
| 6,271,916 B1 | 8/2001 | Marxer et al. |
| 6,278,119 B1 | 8/2001 | Nikzad et al. |
| 6,285,018 B1 | 9/2001 | Aebi et al. |
| 6,297,879 B1 | 10/2001 | Yang et al. |
| 6,307,586 B1 | 10/2001 | Costello |
| 6,346,700 B1 | 2/2002 | Cunningham et al. |
| 6,362,484 B1 | 3/2002 | Beyne et al. |
| 6,373,869 B1 | 4/2002 | Jacob |
| 6,403,963 B1 | 6/2002 | Nikzad et al. |
| 6,535,531 B1 | 3/2003 | Smith et al. |
| 6,545,281 B1 | 4/2003 | McGregor et al. |
| 6,608,676 B1 | 8/2003 | Zhao et al. |
| 6,711,283 B1 | 3/2004 | Soenksen |
| 6,837,766 B2 | 1/2005 | Costello |
| 7,005,637 B2 | 2/2006 | Costello et al. |
| 7,039,157 B2 | 5/2006 | Fujii et al. |
| 7,126,699 B1 | 10/2006 | Wihl et al. |
| 7,130,039 B2 | 10/2006 | Vaez-Iravani et al. |
| 7,136,159 B2 | 11/2006 | Tsai et al. |
| 7,141,791 B2 | 11/2006 | Masnaghetti et al. |
| 7,283,166 B1 | 10/2007 | Billman |
| 7,321,468 B2 | 1/2008 | Herkommer et al. |
| 7,345,825 B2 | 3/2008 | Chuang et al. |
| 7,352,457 B2 | 4/2008 | Kvamme et al. |
| 7,432,517 B2 | 10/2008 | Botma et al. |
| 7,446,474 B2 | 11/2008 | Maldonado et al. |
| 7,465,935 B2 | 12/2008 | Urano et al. |
| 7,525,649 B1 | 4/2009 | Leong et al. |
| 7,528,943 B2 | 5/2009 | Brown et al. |
| 7,586,108 B2 | 9/2009 | Nihtianov et al. |
| 7,609,309 B2 | 10/2009 | Brown et al. |
| 7,714,287 B1 | 5/2010 | James et al. |
| 7,741,666 B2 | 6/2010 | Nozaki et al. |
| 7,750,280 B2 | 7/2010 | Hwang et al. |
| 7,791,170 B2 | 9/2010 | Chiang et al. |
| 7,800,040 B2 | 9/2010 | Blacksberg et al. |
| 7,813,406 B1 | 10/2010 | Nguyen et al. |
| 7,838,833 B1 | 11/2010 | Lent et al. |
| 7,875,948 B2 | 1/2011 | Hynecek et al. |
| 7,928,382 B2 | 4/2011 | Hatakeyama et al. |
| 7,952,633 B2 | 5/2011 | Brown et al. |
| 7,985,658 B2 | 7/2011 | Lei et al. |
| 8,017,427 B2 | 9/2011 | Manabe |
| 8,138,485 B2 | 3/2012 | Nihtianov et al. |
| 8,309,443 B2 | 11/2012 | Tanaka et al. |
| 8,323,406 B2 | 12/2012 | Bondokov et al. |
| 8,450,820 B2 | 5/2013 | Nanver et al. |
| 8,455,971 B2 | 6/2013 | Chen et al. |
| 8,513,587 B2 | 8/2013 | Wang et al. |
| 8,514,587 B2 | 8/2013 | Zhang et al. |
| 8,629,384 B1 | 1/2014 | Biellak et al. |
| 8,686,331 B2 | 4/2014 | Armstrong |
| 8,755,417 B1 | 6/2014 | Dribinski |
| 8,803,075 B2 | 8/2014 | Menge et al. |
| 8,873,596 B2 | 10/2014 | Dribinski et al. |
| 8,891,079 B2 | 11/2014 | Zhao et al. |
| 8,929,406 B2 | 1/2015 | Chuang et al. |
| 9,305,949 B2 | 4/2016 | Chen et al. |
| 9,411,244 B2 | 8/2016 | Ryzhikov et al. |
| 9,426,400 B2 | 8/2016 | Brown et al. |
| 9,478,402 B2 | 10/2016 | Chuang et al. |
| 9,496,425 B2 | 11/2016 | Chern et al. |
| 9,529,182 B2 | 12/2016 | Chuang et al. |
| 9,601,299 B2 | 3/2017 | Chuang et al. |
| 9,608,399 B2 | 3/2017 | Chuang et al. |
| 9,748,294 B2 | 8/2017 | Muramatsu et al. |
| 9,818,887 B2 | 11/2017 | Chern et al. |
| 10,115,663 B2 * | 10/2018 | Or-Bach ............... H01L 27/088 |
| 10,197,501 B2 | 2/2019 | Chuang et al. |
| 10,269,842 B2 | 4/2019 | Muramatsu et al. |
| 2001/0017344 A1 | 8/2001 | Aebi |
| 2003/0043876 A1 | 3/2003 | Lublin et al. |
| 2003/0222579 A1 | 12/2003 | Habib et al. |
| 2004/0021061 A1 | 2/2004 | Bijkerk |
| 2004/0056279 A1 | 3/2004 | Niigaki et al. |
| 2004/0227070 A1 | 11/2004 | Bateman et al. |
| 2005/0122021 A1 | 6/2005 | Smith et al. |
| 2005/0167575 A1 | 8/2005 | Benz et al. |
| 2005/0190452 A1 | 9/2005 | Govorkov et al. |
| 2005/0196059 A1 | 9/2005 | Inoue et al. |
| 2005/0233493 A1 | 10/2005 | Augusto et al. |
| 2005/0264148 A1 | 12/2005 | Maldonado et al. |
| 2006/0054778 A1 | 3/2006 | Suhling |
| 2006/0055321 A1 | 3/2006 | Maldonado et al. |
| 2006/0069460 A1 | 3/2006 | Smith et al. |
| 2006/0170324 A1 | 8/2006 | Machuca et al. |
| 2006/0188869 A1 | 8/2006 | Zeskind et al. |
| 2007/0002465 A1 | 1/2007 | Chuang et al. |
| 2007/0034987 A1 | 2/2007 | Costello et al. |
| 2007/0064135 A1 | 3/2007 | Brown et al. |
| 2007/0096648 A1 | 5/2007 | Nakajima et al. |
| 2007/0103769 A1 | 5/2007 | Kuwabara |
| 2007/0188744 A1 | 8/2007 | Leslie et al. |
| 2007/0291810 A1 | 12/2007 | Luo et al. |
| 2008/0044932 A1 | 2/2008 | Samoilov et al. |
| 2008/0173903 A1 | 7/2008 | Imai et al. |
| 2008/0315092 A1 | 12/2008 | Kley |
| 2008/0315121 A1 | 12/2008 | Nihtianov et al. |
| 2009/0021717 A1 | 1/2009 | Nihtianov et al. |
| 2009/0045325 A1 | 2/2009 | Tomuta et al. |
| 2009/0091752 A1 | 4/2009 | Terasawa et al. |
| 2009/0108207 A1 | 4/2009 | Liu |
| 2009/0125242 A1 | 5/2009 | Choi et al. |
| 2009/0128912 A1 | 5/2009 | Okada et al. |
| 2009/0168152 A1 | 7/2009 | Gelernt et al. |
| 2009/0180176 A1 | 7/2009 | Armstrong et al. |
| 2009/0324234 A1 | 12/2009 | Kashima |
| 2010/0102213 A1 | 4/2010 | Garris |
| 2010/0103409 A1 | 4/2010 | Ohshima et al. |
| 2010/0148667 A1 | 6/2010 | Niigaki et al. |
| 2010/0188655 A1 | 7/2010 | Brown et al. |
| 2010/0208979 A1 | 8/2010 | Abbott et al. |
| 2010/0233869 A1 | 9/2010 | Park et al. |
| 2011/0073982 A1 | 3/2011 | Armstrong et al. |
| 2011/0101219 A1 | 5/2011 | Uchiyama et al. |
| 2011/0116077 A1 | 5/2011 | Chuang et al. |
| 2011/0168886 A1 | 7/2011 | Shadman et al. |
| 2011/0169116 A1 | 7/2011 | Nanver et al. |
| 2011/0234790 A1 | 9/2011 | True |
| 2011/0256655 A1 | 10/2011 | Nikzad et al. |
| 2011/0261354 A1 | 10/2011 | Sinfield et al. |

(56) References Cited

U.S. PATENT DOCUMENTS

| | | |
|---|---|---|
| 2011/0291109 A1 | 12/2011 | Wraback et al. |
| 2011/0291219 A1 | 12/2011 | Kwon |
| 2012/0007920 A1 | 1/2012 | Takahashi |
| 2012/0012811 A1 | 1/2012 | Deflumere et al. |
| 2012/0012957 A1 | 1/2012 | Larsen et al. |
| 2012/0081684 A1 | 4/2012 | Den et al. |
| 2012/0132823 A1 | 5/2012 | Menge et al. |
| 2012/0160993 A1 | 6/2012 | Nevet et al. |
| 2012/0170021 A1 | 7/2012 | Walsh |
| 2012/0217558 A1 | 8/2012 | Togashi |
| 2012/0228485 A1 | 9/2012 | Iwakiri et al. |
| 2012/0268722 A1 | 10/2012 | Nihtianov et al. |
| 2013/0009069 A1 | 1/2013 | Okada |
| 2013/0016346 A1 | 1/2013 | Romanovsky et al. |
| 2013/0017205 A1 | 1/2013 | Giaccia et al. |
| 2013/0020491 A1 | 1/2013 | Mazzillo |
| 2013/0056843 A1 | 3/2013 | Lee et al. |
| 2013/0077086 A1 | 3/2013 | Chuang et al. |
| 2013/0082241 A1 | 4/2013 | Kub et al. |
| 2013/0088706 A1 | 4/2013 | Chuang et al. |
| 2013/0126705 A1 | 5/2013 | Maleev, IV |
| 2013/0169957 A1 | 7/2013 | Wolf et al. |
| 2013/0176552 A1 | 7/2013 | Brown et al. |
| 2013/0270663 A1 | 10/2013 | Lin et al. |
| 2013/0313440 A1 | 11/2013 | Chuang et al. |
| 2013/0320211 A1 | 12/2013 | Park et al. |
| 2013/0336574 A1 | 12/2013 | Nasser-Ghodsi et al. |
| 2013/0341504 A1 | 12/2013 | Neill et al. |
| 2014/0151552 A1 | 6/2014 | Jiang et al. |
| 2014/0203386 A1 | 7/2014 | Bui et al. |
| 2014/0246595 A1 | 9/2014 | Menge et al. |
| 2014/0305367 A1 | 10/2014 | Chuang et al. |
| 2014/0362203 A1 | 12/2014 | Delaney et al. |
| 2015/0007765 A1 | 1/2015 | Dribinski |
| 2015/0294998 A1 | 10/2015 | Nihtianov et al. |
| 2016/0351604 A1 | 12/2016 | Kalnitsky et al. |

FOREIGN PATENT DOCUMENTS

| | | |
|---|---|---|
| EP | 1939917 A2 | 7/2008 |
| EP | 2346094 A1 | 7/2011 |
| JP | H08241977 A | 9/1996 |
| JP | H10171965 A | 6/1998 |
| JP | 2002033473 | 1/2002 |
| JP | 2004031452 A | 1/2004 |
| JP | 2007040909 A | 2/2007 |
| JP | 2007086108 A | 4/2007 |
| JP | 2009117454 A | 5/2009 |
| JP | 2010003755 A | 1/2010 |
| KR | 100688497 B1 | 3/2007 |
| KR | 100826407 B1 | 5/2008 |
| RU | 2297070 C2 | 4/2007 |
| WO | 9532518 A1 | 11/1995 |
| WO | 9617372 A1 | 6/1996 |
| WO | 2007035858 A2 | 3/2007 |
| WO | 2011091159 A1 | 7/2011 |
| WO | 2013006867 A1 | 1/2013 |
| WO | 2014067754 A2 | 5/2014 |

OTHER PUBLICATIONS

Allen et al., Work Function, Photoelectric Threshold, and Surface . . . ; Physical Review, vol. 127, No. 1, Jul. 1, 1962, pp. 150-158.
Armstrong, Carter M.The Quest for the Ultimate Vacuum Tube, Spectrum IEEE, Dec. 2015, 4 pgs.
Ding, MengField Emission from Silicon, MIT 2001, 277 pgs.
Fanton et al, Multiparameter Measurements of Thin Film . . . , Journal of Applied Physics, vol. 73, No. 11, p. 7035 (1993).
Field Emitter Review, 7 pgs in Japanese.
Fowler, R. H., et al, Electron Emission in Intense Electric Fields, Mar. 31, 1928, 9 pgs.
Fu et al., Optimizing GaN photocathode structure for higher . . . ; Optik, vol. 123, No. 9, May 2012, pp. 756-768.
Hecht, Optics, Fourth Edition, India: Pearson Education Pte, Ltd. 2004.
Hecht, Optics, Second Edition, Adelphi University, 1987, Addison-Wesley Publishing Company, Inc., 3 pages.
Henderson, Brian S., Study of Negative Electron Affinity . . . , Dept. of Physics, Rice Univ., Aug. 7, 2009, 18 pgs.
Howorth et al., Transmission silicon photoemitters . . . , Jrnl of Physics D: Applied Physics, vol. 9, No. 5, Apr. 1, 1976, pp. 785-794.
ISR and Written Opinion dated Mar. 31, 2014 for PCT/US2013/074124).
J. Electrochem. Soc., vol. 141, No. 3, Mar. 1994, pp. 843-848.
Janesick, James R., Scientific Charge-Coupled Devices, SPIE Press, 2001, pp. 556-561.
KLA-Tencor Coporation, filed U.S. Appl. No. 62/059,368, filed Oct. 3, 2014 and entitled "183nm Laser and Inspection System".
Koike, AkifumiField Emitter Equipped With a Suppressor to Control Emission Angel, IEEE Electron Device Letters, vol. 34, No. 5, May 2013, 3 pgs.
Martinelli, Ramon U., Infrared Photoemission from Silicon, Applied Physics Letters, vol. 16, No. 7, Apr. 1, 1970, pp. 261-262.
Martinelli, Ramon U., Reflection and Transmission Secondary Emission . . . , Applied Physics Letters, vol. 17, No. 8, Oct. 15, 1970, pp. 313-314.
Nagao, Masayoshi, Cathode Technologies for Field Emission Displays, IEEJ Trans 2006; 1:171-178, 8 pgs.
Nagao, MasayoshiFabrication of a Field Emitter Array with a Built-In Einzel Lens, JJAP 48 (2008) 06FK02, 4 pgs.
Nanver et al., Pure-Boron Chemical-Vapor-Deposited Layers: a New Material for Silicon Device Processing, 18th IEEE International Conference on Advanced Thermal Processing of Semiconductors (RTP), Sep. 28, 2010-Oct. 1, 2010, pp. 136-139.
Nanver, Silicon Photodiodes for Low Penetration Depth Beams such as DUV/VUV/EUV Light and Low-Energy Electrons, Advances in Photodiodes, G. Betta, ed., Mar. 22, 2011, pp. 205-224, www.intechopen.com.
Neo, YoichiroElectron Optical Properties of Microcolumn with Field Emitter, JJAP 52 (2013) 036603, 5 pgs.
Pain; et al., "Pain et al., "A Back-Illuminated Megapixel CMOS Image Sensor", Jun. 9, 2005, IEEE Workshop on Charge-Coupled Devices and Advanced Image Sensors, Karuizawa, Japan, 4 pgs."
Rakhshandehroo, M.R. et al, Fabrication of a self-aligned silicon field emission . . . , JVSTB, 16, 765 (1998); doi: 10.1116/1,589900, 6 pgs.
Rakhshandehroo, M.R. et al, Field emission from gated Si emitter tips with precise . . . , JVSTB, 15, 2777 (1997); doi: 10.1116/1.589726, 6 pgs.
Raoult, Efficient generation of narrow-bandwidth . . . , Jul. 15, 1998, vol. 23, No. 14, Optics Letters, pp. 1117-1119.
Sarubbi et al., Chemical Vapor Deposition of α-Boron Layers on Silicon for Controlled Nanometer-Deep p+ n Junction Formation, J. Electron. Mat., vol. 39, No. 2, Feb. 2010, pp. 162-173.
Sarubbi et al., Pure boron-doped photodiodes . . . IEEE, Sep. 15, 2008, pp. 278-281.
Sato, T., et al, Fabrication and characterization of HfC coated . . . , J. Vac. Sci. Technol. B 2194), published Jul. 31, 2003, 5 pgs.
Serbun Pavel et al, Stable field emission of single B-doped . . . , JVSTB, 31, 02B101 (2013); doi: 10.1116/1.4765088, 7 pgs.
Sobieski, Stanley, Intensified Charge Coupled Devices for Ultra Low Light Level Imaging, NASA, Goddard Space Flight Center, SPIE vol. 78 (1976) Low Light Level Devices, pp. 73-77.
Tobin, Kenneth W., Inspection in Semiconductor Manufacturing, Webster's Encyclopedia of Electrical and Electronic Engineering, vol. 10, pp. 242-262, Wiley & Sons, NY, NY, 1999.
Utsumi, Takao, Vacuum Microelectrnoics: What's New and Exciting, IEEE vol. 38, No. 10, Oct. 1991, 8 pgs.
Xiaogian, Fu, Higher Quantum Efficiency by Optimizing . . . 978-1-4244-6644-3/10 IEEE, pp. 234-235.

* cited by examiner

BACK-ILLUMINATED SENSOR AND A METHOD OF MANUFACTURING A SENSOR

RELATED APPLICATIONS

This application claims priority from U.S. Provisional Patent Application 62/686,667, entitled "BACK-ILLUMINATED SENSOR AND A METHOD OF MANUFACTURING A SENSOR", which was filed on Jun. 18, 2018, and is incorporated by reference herein.

BACKGROUND OF THE DISCLOSURE

Field of the Disclosure

The present application relates to image sensors suitable for sensing radiation in deep UV (DUV) and vacuum UV (VUV) wavelengths, and to methods for making such image sensors. These sensors are suitable for use in photomask, reticle, or wafer inspection systems and for other applications.

Related Art

The following description and examples are not admitted to be prior art by virtue of their inclusion in this section.

The integrated circuit industry requires inspection tools with increasingly higher resolution to resolve ever smaller features of integrated circuits, photomasks, reticles, solar cells, charge coupled devices etc., as well as detect defects whose sizes are on the order of, or smaller than, those feature sizes.

Inspection systems operating at short wavelengths, e.g. wavelengths shorter than about 250 nm, can provide such resolution in many cases. Specifically, for photomask or reticle inspection, it is desirable to inspect using a wavelength identical, or close, to the wavelength that will be used for lithography, i.e. close to 193.4 nm for current generation lithography and close to 13.5 nm for future EUV lithography, as the phase-shifts of the inspection light caused by the patterns will be identical or very similar to those caused during lithography. For inspecting semiconductor patterned wafers, inspection systems operating over a relatively broad range of wavelengths, such as a wavelength range that includes wavelengths in the near UV, DUV, and/or VUV ranges, can be advantageous because a broad range of wavelengths can reduce the sensitivity to small changes in layer thicknesses or pattern dimensions that can cause large changes in reflectivity at an individual wavelength.

In order to detect small defects or particles on photomasks, reticles, and semiconductor wafers, high signal-to-noise ratios are required. High photon flux densities are required to ensure high signal-to-noise ratios when inspecting at high speed because statistical fluctuations in the numbers of photons detected (Poisson noise) is a fundamental limit on the signal-to-noise ratio. In many cases, approximately 100,000 or more photons per pixel are needed. Because inspection systems are typically in use 24 hours per day with only short stoppages, the sensors are exposed to large doses of radiation after only a few months of operation.

A photon with a vacuum wavelength of 250 nm has energy of approximately 5 eV. The bandgap of silicon dioxide is about 10 eV. Although it would appear that such wavelength photons cannot be absorbed by silicon dioxide, silicon dioxide as grown on a silicon surface must have some dangling bonds at the interface with the silicon because the silicon dioxide structure cannot perfectly match that of the silicon crystal. Furthermore, because the single dioxide is amorphous, there are likely also some dangling bonds within the material. In practice, there will be a non-negligible density of defects and impurities within the oxide, as well as at the interface to underlying semiconductor, that can absorb photons with DUV wavelengths, particularly those shorter than about 220 nm in wavelength. Furthermore, under high radiation flux density, two high-energy photons may arrive near the same location within a very short time interval (nanoseconds or picoseconds), which can lead to electrons being excited to the conduction band of the silicon dioxide by two absorption events in rapid succession or by two-photon absorption.

A further requirement for sensors used for inspection, metrology and related applications is high sensitivity. As explained above, high signal-to-noise ratios are required. If the sensor does not convert a large fraction of the incident photons into signal, then a higher intensity light source would be required in order to maintain the same inspection or measurement speed compared with an inspection or metrology system with a more efficient sensor. A higher intensity light source would expose the instruments optics and the sample being inspected or measured to higher light intensities, possibly causing damage or degradation over time. A higher intensity light source would also be more expensive or, particularly at DUV and VUV wavelengths, may not be available.

DUV and VUV wavelengths are strongly absorbed by silicon. Such wavelengths may be mostly absorbed within about 10 nm or a few tens of nm of the surface of the silicon. The efficiency of a sensor operating at DUV or VUV wavelengths depends on how large a fraction of the electrons created by the absorbed photons can be collected before the electrons recombine. Silicon dioxide can form a high-quality interface with silicon with a low density of defects. Most other materials including many of those commonly used for anti-reflection coatings, if deposited directly on silicon, result in a very high density of electrical defects at the surface of silicon. A high density of electrical defects on the surface of silicon may not be an issue for a sensor intended to operate at visible wavelengths, as such wavelengths may typically travel about 100 nm or more into the silicon before being absorbed and may, therefore, be little affected by electrical defects on the silicon surface. However, DUV and VUV wavelengths are absorbed so close to the silicon surface that electrical defects on the surface and/or trapped charged within the layer(s) on the surface can result in a significant fraction of the electrons created recombining at, or near, the silicon surface and being lost, resulting in a low efficiency sensor.

U.S. Pat. Nos. 9,496,425 and 9,818,887, both to Chern et al., describe image sensor structures and methods of making image sensors that include a boron layer deposited on, at least, an exposed back surface of the image sensor. Different ranges of temperature for deposition of the boron are disclosed, including a range of about 400-450° C. and a range of about 700-800° C. The inventors have discovered that one advantage of a higher deposition temperature for the boron, such as a deposition temperature between about 600° C. and about 900° C., is that at such temperatures boron diffuses into the silicon providing a very thin, heavily p-type doped silicon layer on the light-sensitive back surface. This p-type doped silicon layer is important for ensuring a high quantum efficiency to DUV and VUV radiation because it creates a static electric field near the surface that accelerates electrons away from the surface into the silicon layer. The p-type silicon also increases the conductivity of the back surface of the silicon, which is important for high-speed operation of an image sensor, since a return path is needed for ground currents induced by the switching of signals on electrodes on the front surface of the sensor.

However, processing temperatures higher than 450° C. cannot be used on semiconductor wafers that include conventional CMOS circuits because 450° C. is close to the melting point metals such as aluminum and copper commonly used in fabricating CMOS devices. At high temperatures, such as those greater than 450° C., these metals expand, become soft and can delaminate. Furthermore, at high temperatures copper can easily diffuse through silicon which will modify the electrical properties of the CMOS circuits. Thinning a wafer before any metals are deposited on it allows a boron layer to be deposited on the back surface as described in the aforementioned patents at a temperature between 600 and 900° C. enabling boron to diffuse into the surface during, or subsequent to, the deposition of the boron layer. Subsequently metal interconnects can be formed on the front surface. After the image sensor regions of the wafer have been thinned, for example to a thickness of about 25 μm or thinner, the thinned region can be significantly warped and may have peak-to-valley non-flatness of many tens of microns or more. So, it is necessary to use relatively wide metal interconnect lines and vias, such as multiple microns wide or more, to ensure that the lines and vias connect in spite of any misalignment caused by the non-flatness. Such wide metal interconnects and vias increase the capacitance per unit area associated with those lines and vias. Furthermore, wide interconnects and vias can make it difficult, or impossible, to interconnect all the signals on a large area sensor with about one million or more pixels. In some cases, polysilicon jumpers may be needed to connect together metal interconnects, but polysilicon has much higher resistivity than any metal, so the use of such jumpers can limit the maximum operating speed of a sensor.

Therefore, a need arises for an image sensor capable of efficiently detecting high-energy photons without degrading yet overcoming some, or all, of the above disadvantages. In particular, a method of fabricating a back-thinned image sensor with a boron layer and boron doping on its back surface while allowing formation of metal interconnects on a relatively flat wafer (i.e. with a flatness of about 10 μm or less) would allow the use of finer design rules (such as the design rules corresponding to a 0.35 μm process or finer). Such a method would allow narrower metal lines connecting to critical features such as the floating diffusion, enabling smaller floating-diffusion capacitance and higher charge to voltage conversions ratios. Finer design rules also allow more interconnect lines per unit area of the sensor and allow more flexibility in connecting the circuits on the image sensor.

SUMMARY OF THE DISCLOSURE

Image sensors and methods of fabricating image sensors with high-quantum-efficiency for imaging DUV and/or VUV are described. These image sensors are capable of long-life operation under high fluxes of DUV and VUV radiation. These methods include process steps to form light sensitive active and/or passive circuit elements in a layer on a semiconductor (preferably silicon) wafer, as well as forming metal interconnections between the electrical elements of the sensor. These image sensors can include fine metal interconnects and vias (such as those conforming to about 0.35 μm, or finer, design rules), while having a backside surface coated with a boron layer and having a highly doped p-type silicon layer immediately adjacent to the boron layer. The metal interconnections may comprise tungsten, molybdenum or other refractory (i.e. high melting point) metal. In one embodiment, the metal interconnections may consist of only refractory metals. In one embodiment, the deposition processes used to form the metal interconnections may be configured to reduce the stress within the metal layers. In one embodiment additional metal interconnections comprising aluminum or copper may be added on top of, and connected to, metal interconnections comprising the refractory metal.

An exemplary method of fabricating an image sensor includes forming an epitaxial layer on a substrate, forming a gate layer on the epitaxial layer, the gate layer comprising one or more layers of dielectric materials such as silicon dioxide and silicon nitride, forming circuit elements on the gate layer comprising polysilicon and dielectric materials, forming first metal vias and first metal interconnects to connect together at least some of those circuit elements, thinning the substrate to expose at least a portion of the epitaxial layer (the exposed epitaxial layer is referred to herein as a semiconductor membrane), forming a pure boron layer directly on the exposed portions of the epitaxial layer, diffusing boron into the epitaxial layer during and/or subsequent to forming the boron layer, and optionally forming one, or more, anti-reflection layers directly on the surface of the boron layer. As used herein, the phrase "circuit elements" refers to light sensitive devices such as charge-coupled devices and photodiodes, other semiconductor devices such as transistors, diodes, resistors and capacitors, and electrical interconnections (often called interconnects) between them. These circuit elements are formed using standard semiconductor manufacturing processes including, but not limited to, photolithography, deposition, etching, ion implantation and annealing. The first metal interconnects comprise a refractory metal such as tungsten or molybdenum. Thinning the sample (e.g. a wafer) can be performed using ion etching, chemical etching and/or polishing. Notably, this thinning can increase the sensitivity of the image sensor to light impinging the back surface. An anti-reflection coating may be formed on the boron layer. The method may further include forming one or more additional interconnect layers on top of, and connected to, the first interconnects after forming the pure boron layer. The additional interconnect layers may comprise a metal such as aluminum or copper, as these layers need not be exposed to temperatures greater than about 450° C. The additional interconnect layers may be fabricated following design rules corresponding to a 1 μm process or coarser so that they may be formed on a surface that may have 10 μm or more of non-flatness.

Another method of fabricating an image sensor includes forming an epitaxial layer on a substrate, then forming circuit elements on the epitaxial layer. This step includes forming metal interconnects. The metal interconnects may comprise, or may consist entirely of, refractory metals such as tungsten and molybdenum. A protective layer may be formed on the circuit elements. A handle wafer may be bonded to the surface that includes the circuit elements. The substrate is then thinned to expose, at least part of, the epitaxial layer. As indicated above, this thinning can increase the sensitivity of the image sensor to light impinging on the back surface. A pure boron layer is formed on the surface of the epitaxial layer exposed in the thinning process. The pure boron layer may be deposited at a temperature higher than 600° C. or may be raised to a temperature higher than 600° C. after deposition to cause boron to diffuse into the epitaxial layer. An anti-reflection coating may be formed on the boron layer.

Image sensors with high-quantum-efficiency and long-life operation for DUV, and/or VUV radiation are described. These image sensors are thinned from the back-side so that they are highly sensitive to radiation impinging on the back-side of the image sensors (wherein these image sensors are back-illuminated). The image sensors include first metal interconnects comprising, or consisting entirely of, refractory metals such as tungsten and molybdenum. Deposited directly on the back surface of the epitaxial layer is a thin (e.g. between about 2 nm and about 20 nm thick) layer high-purity amorphous boron. In one embodiment, one or more additional layers of material may be coated on the boron. The thickness and material of each layer may be chosen to increase the transmission of a wavelength of interest into the image sensor, and/or to protect the boron layer from damage. In one embodiment second metal interconnects may be formed on top of, and connected to, the first metal interconnects. The second metal interconnects may comprise one of aluminum and copper, and may be arranged according to 1 μm or coarser design rules.

The image sensors described herein may be fabricated using CCD (charge coupled device) or CMOS (complementary metal oxide semiconductor) technology. The image sensors may be two-dimensional area sensors, or one-dimensional array sensors.

DETAILED DESCRIPTION OF THE DRAWINGS

Figure 1:
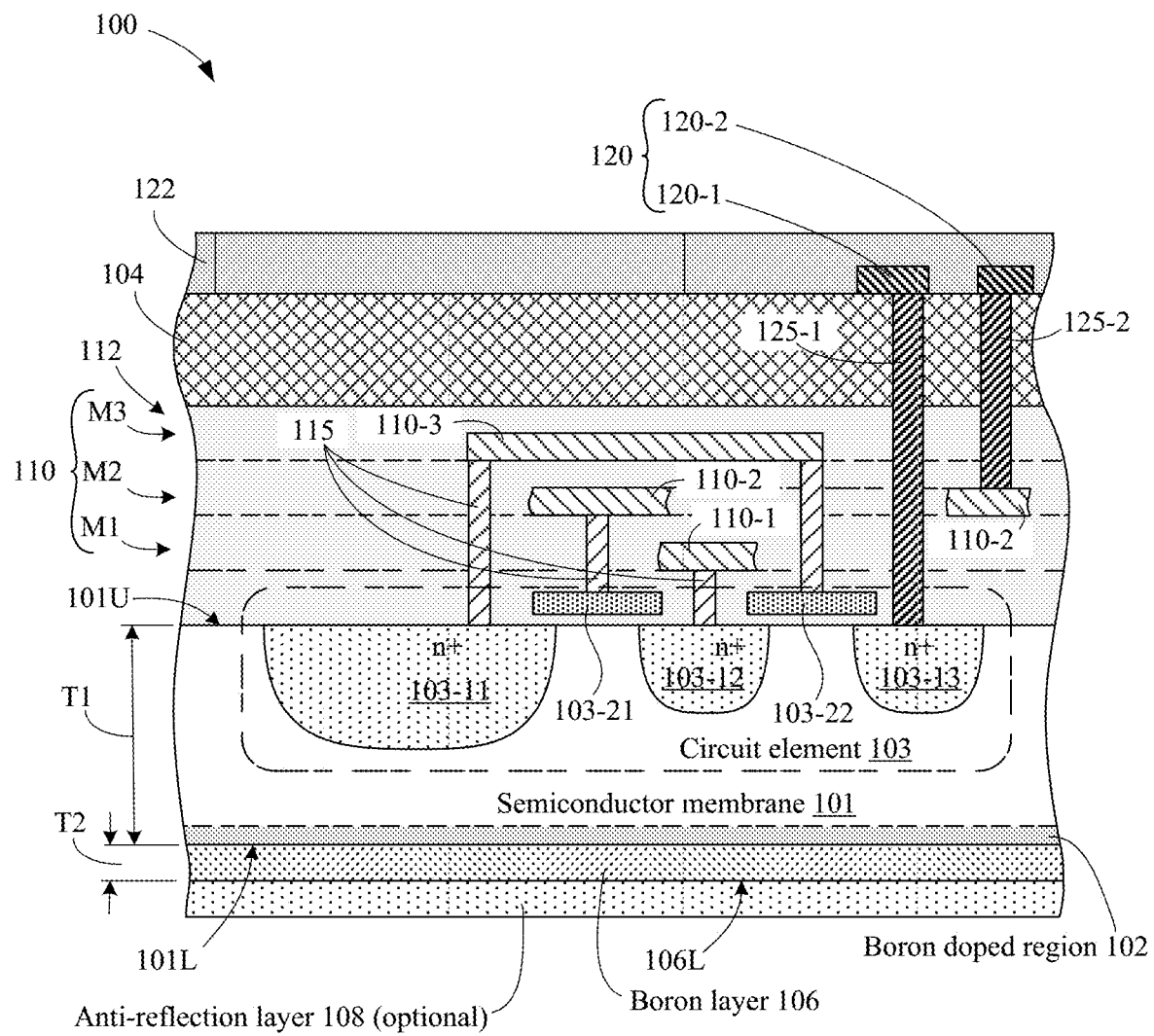
FIG. 1 is a cross-sectional view showing an exemplary image sensor produced in accordance with the present invention.

FIG. 1 is a cross-sectional side view depicting a portion of an image sensor 100 configured to sense deep ultraviolet (DUV) radiation, vacuum ultraviolet (VUV) radiation, extreme ultraviolet (EUV) radiation or charged particles according to an exemplary embodiment of the present invention. Image sensor 100 includes a circuit element 103 formed on an upper (first) surface 101U of a semiconductor membrane 101, first metal interconnects 110 disposed in dielectric material layers 112 over circuit element 103, and a pure boron layer 106 formed on a lower (second) surface 101L of semiconductor membrane 101.

In one embodiment, semiconductor membrane 101 comprises a layer of lightly p-doped epitaxial silicon having a thickness T1 in a range of 10 μm to 40 μm and a p-type (boron) dopant concentration in a range of about $10^{13}$ cm$^{-3}$ to $10^{14}$ cm$^{-3}$.

Circuit element 103 includes a sensor device (e.g., a light sensitive device such as a photodiode) and associated control transistors that are formed on (i.e., into and over) an upper (first) surface 101U of semiconductor membrane 101. In the depicted exemplary embodiment, circuit element 103 includes spaced-apart n+ doped diffusion regions 103-11, 103-12 and 103-13 that extend from upper surface 101U into corresponding portions of semiconductor membrane 101, and polycrystalline silicon (polysilicon) gate structures 103-21 and 103-22 that are respectively separated from upper surface 101U by intervening gate oxide layers. The depicted configuration of the diffusion regions and gate structures forming circuit element 103 is provided solely to for purposes of describing exemplary circuit element structures and is not intended to represent a functional sensor device or to limit the appended claims.

In one embodiment, pure boron layer 106 is formed using techniques described below such that pure boron layer 106 has a thickness T2 in the range of 2 nm and 20 nm. In one embodiment, pure boron layer 106 comprises a boron concentration of 80% or higher, with inter-diffused silicon atoms and oxygen atoms predominantly making up the remaining 20% or less.

According to a first aspect, image sensor 100 includes a heavily p-doped region 102 that extends from lower surface 101L into semiconductor membrane 101 (i.e., such that p-doped region 102 is disposed immediately adjacent to pure boron layer 106). In one embodiment, p-doped region 102 is a boron-doped region that is formed by the diffusion of boron atoms through lower surface 101L during, or immediately following, the formation of pure boron layer 106. Preferably p-doped region 102 should have a maximum dopant concentration immediately adjacent to lower surface 101L, with the dopant concentration decreasing with distance into semiconductor membrane 101 away from lower surface 101L. In an exemplary embodiment, p-doped region 102 has a nominal p-type doping concentration greater than $10^{19}$ cm$^{-3}$ immediately adjacent to lower surface 101L and decreases to a dopant concentration similar to that of the semiconductor membrane 101 (for example a dopant concentration in the range of $10^{13}$ cm$^{-3}$ to $10^{14}$ cm$^{-3}$) over a distance of between 10 nm and 50 nm away from that lower surface.

According to a second aspect, first metal interconnects 110 and corresponding first metal vias 115 comprise a refractory metal (e.g., one or both of tungsten and molybdenum) for reasons that will become clear below. In the exemplary embodiment, first metal interconnects include metal lines 110-1, 110-2 and 110-3 that are respectively formed as part of three metallization processes M1, M2 and M3, which also include the formation of first metal vias 115 such that first metal interconnects 110 are electrically connected to associated portions of circuit element 103. The configuration of first metal interconnects 110 and first metal vias 115 is arbitrarily depicted for illustrative purposes and not intended to be limiting (e.g., first metal interconnects 110 may be formed in any number of metal layers).

In another specific embodiment, an optional anti-reflection coating 108 is deposited on a lower (outward-facing) surface 106L of pure boron layer 106, and thickness T2 of pure boron layer 106 is in the range of 3 nm to 10 nm.

In one embodiment, image sensor 100 includes an optional protection layer 104 that is formed over dielectric layer 112 such that (first) metal interconnects 110 are entirely disposed between protection layer 104 and semiconductor membrane 101. In alternative embodiments, protection layer 104 is either implemented by a portion of a handler wafer (e.g., monocrystalline silicon or glass) or implemented by a layer of protective material (e.g., silicon dioxide, silicon nitride or silicon oxynitride) that is attached/formed over dielectric layer 112. In one embodiment, protection layer 104 has a thickness in the range of 0.5 µm to 3 µm. In other embodiments, protection layer 104 is omitted entirely.

In one embodiment, one or more second metal interconnects 120 are formed in a second dielectric layer 122 over first metal interconnects 110 and coupled to circuit element 103 by way of second metal vias. For example, second metal interconnect 120-1 is connected directly to a portion of circuit element 103 by way of second metal via 125-1, and second metal interconnect 120-2 is electrically connected to circuit element 103 by way of second metal via 125-2 and first metal interconnect 110-2. In one embodiment, second metal interconnects 120 comprise at least one of aluminum and copper. In one embodiment, second metal interconnects 120 are disposed over protection layer 104, and second metal vias 125-1 and 125-2 extend through protection layer 104.

Figure 2:
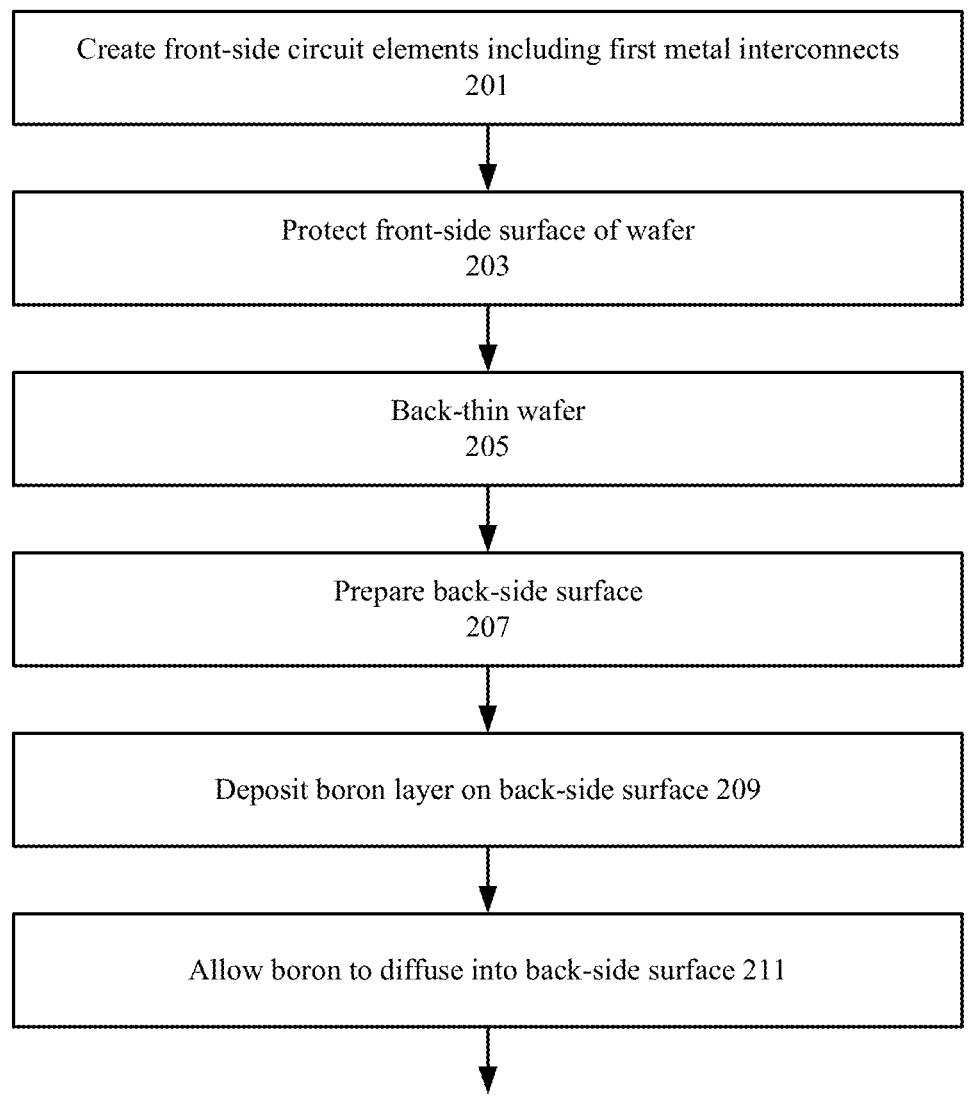
FIGS. 2 and 3 illustrate an exemplary method for fabricating an image sensor.
Figure 3:
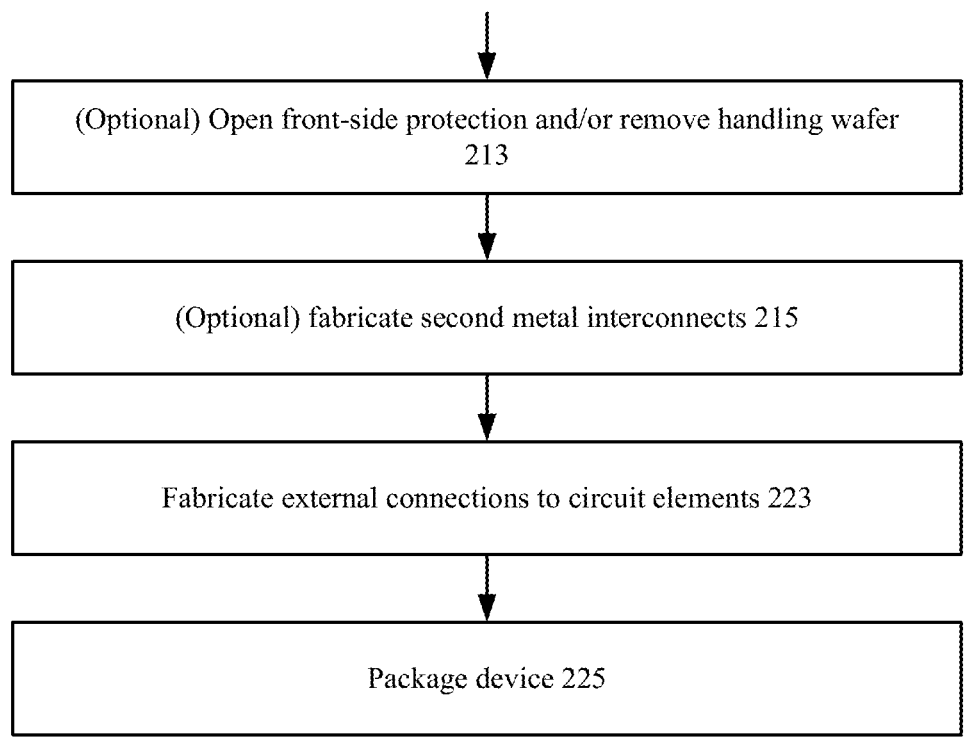

FIGS. 2 and 3 illustrate an exemplary technique 200 for fabricating an image sensor. In this embodiment, the circuit elements can be created in step 201 using standard semiconductor processing steps including lithography, deposition, ion implantation, annealing, and etching. In one embodiment, CCD and/or CMOS sensor elements and devices may also be created in step 201. These circuit elements are created in an epitaxial (epi) layer on the front-side surface of the wafer. In preferred embodiments, the epitaxial layer is about 10 µm to 40 µm thick. The epitaxial layer is lightly p doped (p-). In one embodiment, the epitaxial layer resistivity is between about 10 and 1000 Ωcm. First metal interconnects are created in step 201 using tungsten, molybdenum or other refractory metal, so that the metal interconnects can withstand high temperatures (such as temperatures greater than about 600° C.) in subsequent steps, in particular, in steps 209 and/or 211. Preferably the composition of the first metal interconnects and the processes used to deposit those interconnects may be chosen to reduce the stress in the metals. Deposition processes for depositing reduced stress tungsten are described by, for example, Schmitz et al. in "The Dependence of the Stress of Chemical Vapor Deposited Tungsten Films on Deposition Parameters", J. Electrochem. Soc., 141, pp 843-848 (1994). This document is incorporated herein by reference.

In step 203, the front-side surface of the wafer can be protected. This protection may include depositing one or more protective layers on top of the circuit elements formed during step 201. The one or more protective layers may comprise silicon dioxide, silicon nitride or other material. This protection may also, or instead, include attaching the wafer to a handling wafer, such as a silicon wafer, a quartz wafer, or a wafer made of other material. The handling wafer may include vias comprising a refractory metal such as tungsten or molybdenum for connecting to the circuit elements.

Step 205 involves thinning the wafer from the back-side so as to expose the epitaxial layer in, at least, the active sensor areas. This step may involve polishing, etching, or both. In some embodiments, the entire wafer is back-thinned. In other embodiments, only the active sensor areas are thinned all the way to the epitaxial layer.

Step 207 includes cleaning and preparing the back-side surface prior to the boron deposition. During this cleaning, the native oxide and any contaminants, including organics and metals, should be removed from the back-side surface. In one embodiment, this cleaning can be performed using a dilute HF solution or using an RCA clean process. After cleaning and during preparation, the wafer can be dried using the Marangoni drying technique or a similar technique to leave the surface dry and free of water marks.

In preferred embodiments, the wafer is protected in a controlled atmosphere between steps 207 and 209 (using, e.g. dry nitrogen) to minimize native oxide regrowth after the cleaning.

In step 209, boron is deposited on the back-side surface of the wafer. In one preferred embodiment, this deposition can be done using a mixture of diborane and hydrogen gases at a temperature of about 600-900° C., thereby creating a high-purity amorphous boron layer. In an alternative embodiment, the deposition may be done using diborane, or a diborane-hydrogen mixture, diluted in nitrogen. The thickness of the deposited boron layer depends on the intended application for the sensor. Typically, the boron layer thickness will be between about 2 nm and 20 nm, preferably between about 3 nm and 10 nm. The minimum thickness is set by the need for a pinhole-free uniform film, whereas the maximum thickness depends on the absorption of the photons or charged particles of interest by the boron, as well as the maximum length of time that the wafer can be kept at the elevated temperature.

In step 209, the wafer can be held at a high-temperature for a few minutes in a reducing environment, such as a hydrogen gas. In preferred embodiments, the wafer can be held at a temperature of approximately 800° C. to 850° C. for about 1 to 4 minutes. This high temperature can remove any native oxide layer that might have regrown following step 207.

More details on boron deposition can be found in "Chemical vapor deposition of a-boron layers on silicon for controlled nanometer-deep $p^+$-n junction formation," Sarubbi et al., J. Electron. Material, vol. 39, pp. 162-173, 2010, which is incorporated by reference herein.

In step 211, the wafer is held at a high temperature, such as a temperature between about 600° C. and about 900° C. for a few minutes, such as for a time between about 1 and 10 minutes, to allow boron to diffuse into the surface of the epitaxial layer (e.g., thereby forming boron doped region (doped layer) 102 in membrane 101 just inside surface 101L). The temperature used in step 211 may be similar to, or higher than, the temperature used in 209 for depositing the boron layer. Preferably step 211 is performed in an environment of nitrogen, argon or other inert gas.

After step 211, other layers may be deposited on top of the boron layer. These other layers may include anti-reflection coatings comprised of one or more materials, such as silicon dioxide, silicon nitride, aluminum oxide, hafnium dioxide, magnesium fluoride, and lithium fluoride. These other layers may include a thin protective layer comprising a metal such as ruthenium, tungsten or molybdenum. One or more of these other layers may be deposited using (atomic layer deposition) ALD. An advantage of using an ALD process for depositing these layers is that ALD processes typically allow very precise (single monolayer) control of the thickness of the deposited layer(s). In an alternative embodiment, other layers may be deposited on top of the boron layer after one of the later process steps, such as one of the steps depicted in FIG. 3.

In one embodiment, the protective front-side layer and/or handling wafer may be partially or entirely removed in step 213 in order to expose at least some circuit elements and/or first metal interconnects.

In one embodiment, second metal interconnects may be fabricated on the front-side of the wafer and connected to the first metal interconnects and/or circuit elements in step 215. Second metal interconnects may comprise any convenient metal including copper or aluminum since second metal interconnects may not be subjected to high temperatures (such as temperatures exceeding 450° C.) during subsequent processing steps. Second metal interconnects may be deposited by any appropriate processing technique including, but not limited to, electro-plating, electroless plating, chemical vapor deposition (CVD), ALD, or physical vapor deposition (PVD). Since the wafer may be less flat at step 215 than in step 201, the patterns of the second metal interconnects may follow relatively large design rules (such as design rules corresponding to a 1 µm or coarser process) and may be printed by mask aligner, contact mask or other relatively low-resolution lithography process. The second metal interconnects can form a conduction path in parallel with selected first metal interconnects, thereby reducing the overall resistance of those interconnects and enabling higher-speed operation of the image sensor than would otherwise be possible by first metal interconnects alone, as the first metal interconnects may have relatively higher resistance due to the use of a refractory metal.

In step 223 external connections, such as bonding pads or bump pads are fabricated on the wafer and electrically connected to the circuit elements, for example by connecting to first metal interconnects or to second metal interconnects. The external connections formed in step 223 may be on the front side, back side or both sides of the wafer. In one embodiment, connecting the external connections to first metal interconnects or second metal interconnects may involve creating, opening or exposing vias in the handling wafer, protective front-side layer, or the wafer. In one embodiment through-silicon vias are used to connect external connections on the back side of the wafer to first metal interconnects or second metal interconnects on the front side of the wafer.

In step 225, the resulting structure may be packed in a suitable package. The packing step may comprise flip-chip bonding or wire bonding of the device to the substrate. The package may include a window that transmits wavelengths of interest, or it may comprise a flange or seal for interface to a vacuum seal.

Figure 4A:
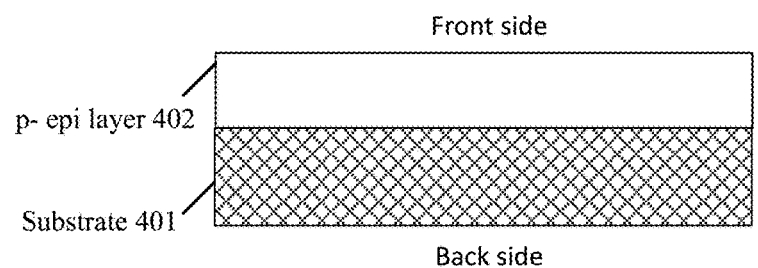
FIGS. 4A-4I illustrate exemplary cross-sections of a wafer subjected to the method described in reference to FIGS. 2 and 3.

FIGS. 4A-4I illustrate exemplary cross-sections of a wafer subjected to method 200 (FIGS. 2 and 3). FIG. 4A illustrates an epitaxial (epi) layer 402 formed on the front side of a substrate 401. Epi layer 402 is preferably a p-epi layer. In one embodiment, the epi layer resistivity is between about 10 and 1000 Ωcm.

Figure 4B:
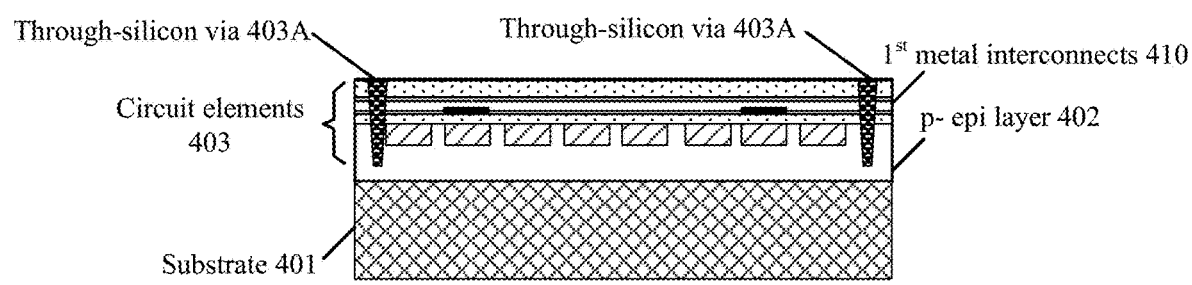

FIG. 4B illustrates various circuit elements 403 including first metal interconnects formed on the epi layer (step 201). Because first metal interconnects 410 are formed while substrate 401 is still hundreds of microns thick and hence not severely warped, first metal interconnects 410 can be formed using normal sub-micron CMOS processing techniques and may include multiple layers of high-density metal interconnects. First metal interconnects 410 comprise a refractory metal such as tungsten or molybdenum. In one embodiment, first metal interconnects 410 consist entirely of refractory metals. In one embodiment, multiple through-silicon vias (TSV) 403A are created around one, or more, edges of the image sensor array in order to allow connection to the circuit elements 403.

Figure 4C:
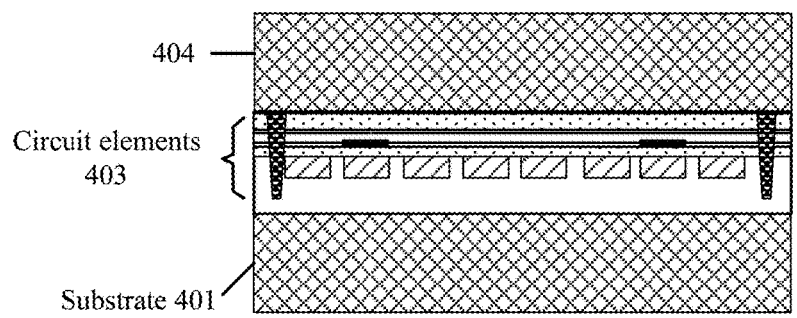

FIG. 4C illustrates a supporting or handling wafer 404 attached to the top of the circuit elements 403 (step 203). Note that the through-silicon vias are shown, but not labeled so as not to overly complicate the drawings. In an alternative embodiment, a protective layer can be used instead of, or in addition to, supporting or handling wafer 404. In one embodiment (not shown), vias are formed in wafer or layer 404 to allow connection to the circuit elements 403.

Figure 4D:
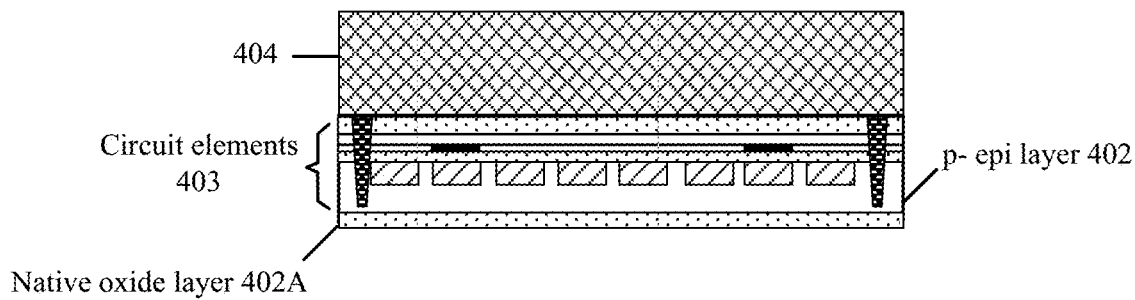

FIG. 4D illustrates the wafer after substrate 401 is back-thinned (step 205) to expose some or all of the back-side surface of epi layer 402 (i.e., the surface opposite to which circuit elements 403 are formed). In the case where substrate 401 is entirely removed, epi layer 402 forms the semiconductor membrane. As depicted in FIG. 4D, a native oxide 402A may form on the surface of epi layer 402 exposed by the back thinning.

Figure 4E:
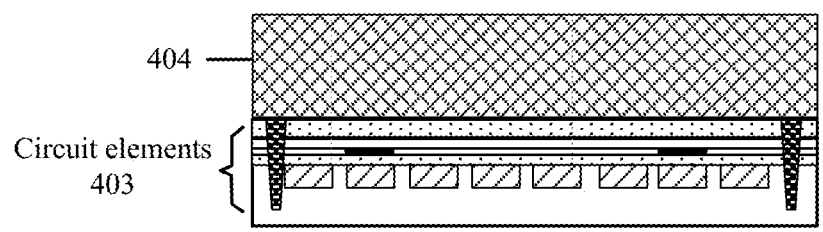

FIG. 4E illustrates the wafer after a cleaning and preparation of the back-side surface (step 207).

Figure 4F:
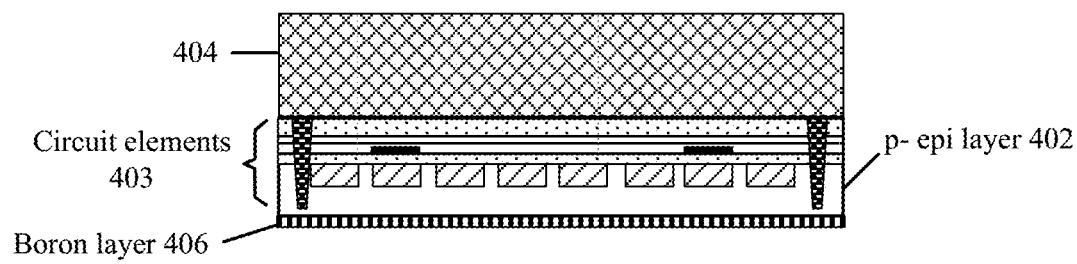

FIG. 4F illustrates a pure boron layer 406 after being formed on the back-side surface of the epi layer 402 (step 209). Diffusion of the boron into the epi layer creates a thin (a few nanometers to a few tens of nanometers) heavily p-doped silicon layer (not shown) at the surface of the epi layer adjacent to the boron layer (step 211).

Figure 4G:
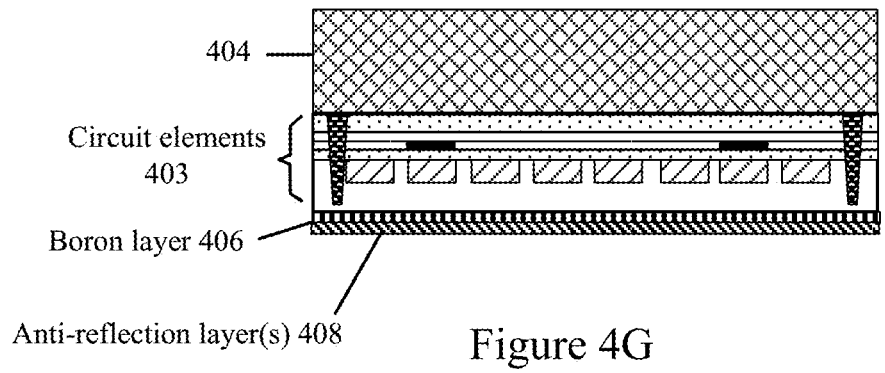

FIG. 4G illustrates one or more optional anti-reflection or protection layers 408 deposited on top of the pure boron layer 406. At least one of the layers may be deposited using an ALD process.

Figure 4H:
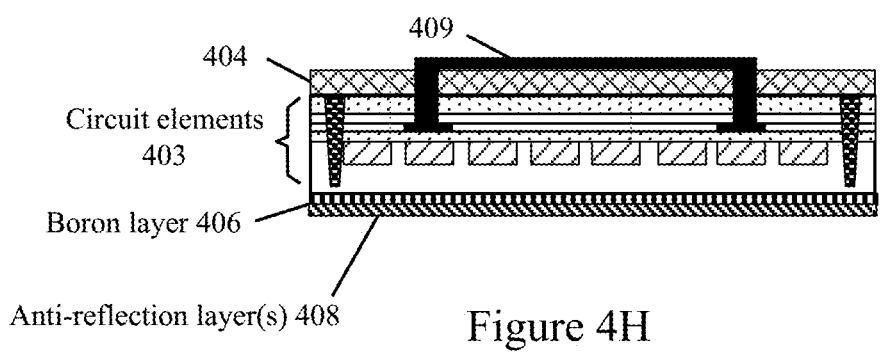

FIG. 4H illustrates the wafer in one embodiment where protective layer or support or handling wafer 404 has been fully or partially removed (step 213) and second metal interconnects (409) fabricated on the front side (step 215). As explained above in reference to FIGS. 2 and 3, second metal interconnects 409 may comprise a metal such as aluminum or copper and may be patterned following much coarser design rules than those used for the first metal interconnects included in circuit elements 403.

Figure 4I:
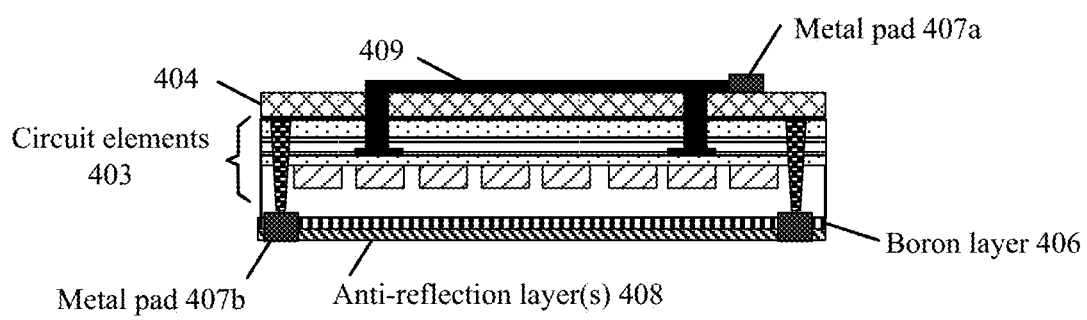

FIG. 4I illustrates the wafer after fabrication of metal pads 407a and 407b (step 223) by appropriate patterning, etching and deposition steps. Pad 407a is fabricated on the front side and electrically connects, for example, to second metal interconnects 409. Pad 407b is fabricated on the back side and electrically connects to TSV 403A. As explained above in reference to FIGS. 2 and 3, the image sensor may include pads only on the front surface (such as pad 407a), only on the back surface (such as pad 407b) or on both front and back surfaces. Note that if optional second metal interconnects are not present, the metal pads will be directly electrically connected to the circuit elements 403.

The above examples are not meant to limit the scope of the invention disclosed herein. They are meant merely as illustrations of how first metal interconnects comprising, or consisting of, refractory metals can be used to fabricate an image sensor, which is subsequently coated with a boron layer on its photo-sensitive surface. Because the first metal interconnects comprise refractory metals, they can withstand high temperatures during the boron deposition and diffusion.

Figure 5:
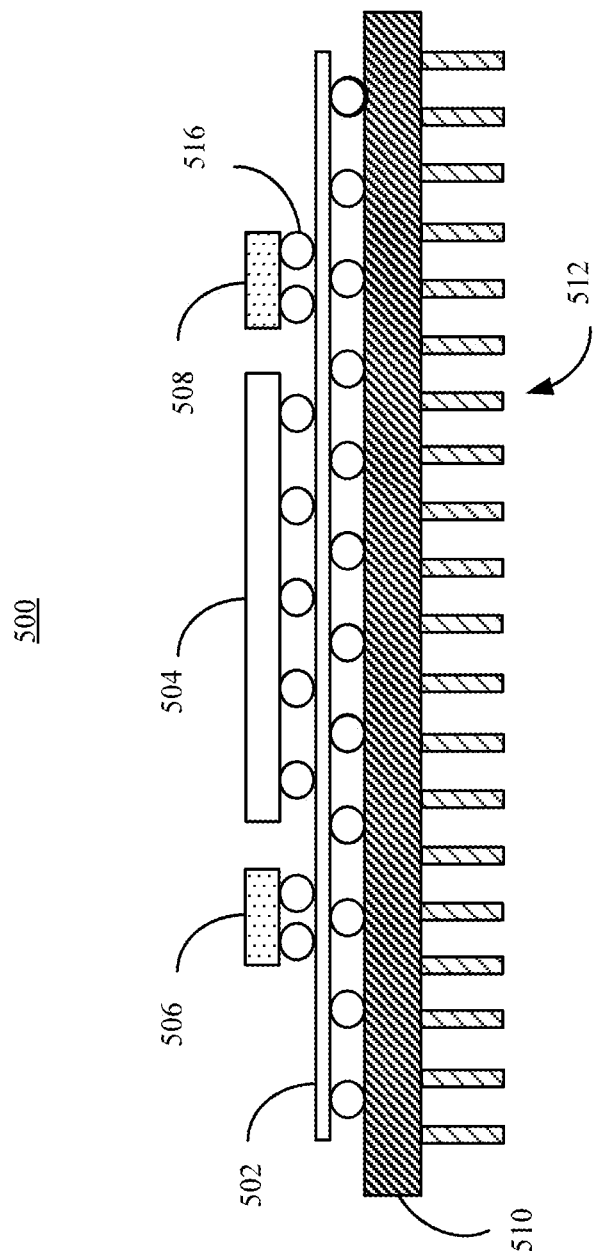
FIG. 5 illustrates an exemplary detector assembly incorporating an image sensor, a silicon interposer, and other electronics.

FIG. 5 illustrates an exemplary detector assembly 500 incorporating an image sensor 504, a silicon interposer 502 and other electronics in accordance with certain embodiments of the present invention.

In one aspect of the present invention, the detector assembly 500 may include one or more light sensitive sensors 504 disposed on the surface of an interposer 502. In one embodiment, the one or more interposers 502 of the assembly 500 may include, but are not limited to, a silicon interposer. In a further aspect of the present invention, the one or more light sensitive sensors 504 of the assembly 500 are back-thinned and further configured for back-illumination including a boron layer and a highly doped layer adjacent to the boron layer as described herein.

In another aspect of the present invention, various circuit elements of the assembly 500 may be disposed on or built into the interposer 502. In one embodiment, one or more amplification circuits (e.g., charge conversion amplifier) (not shown) may be disposed on or built into the interposer 502. In another embodiment, one or more conversion circuits 508 (e.g., analog-to-digital conversion circuits, i.e. digitizers 508) may be disposed on or built into the interposer 502. In another embodiment, one or more driver circuits 506 may be disposed on or built into the interposer 502. For example, the one or more driver circuits 506 may include a timing/serial drive circuit. For instance, the one or more driver circuits 506 may include, but are not limited to, clock driver circuitry or reset driver circuitry. In another embodiment, one or more decoupling capacitors (not shown) may be disposed on or built into the interposer 502. In a further embodiment, one or more serial transmitters (not shown in FIG. 5) may be disposed on or built into the interposer 502.

In another aspect of the present invention, one or more support structures may be disposed between the bottom surface of the light sensitive array sensor 504 and the top surface of the interposer 502 in order to provide physical support to the sensor 504. In one embodiment, a plurality of solder balls 516 may be disposed between the bottom surface of the light sensitive array sensor 504 and the top surface of the interposer 502 in order to provide physical support to the sensor 504. It is recognized herein that while the imaging region of the sensor 504 might not include external electrical connections, the back-thinning of the sensor 504 causes the sensor 504 to become increasingly flexible. As such, solder balls 516 may be utilized to connect the sensor 504 to the interposer 502 in a manner that reinforces the imaging portion of the sensor 504. In an alternative embodiment, an underfill material may be disposed between the bottom surface of the light sensitive array sensor 504 and the top surface of the interposer 502 in order to provide physical support to the sensor 504. For example, an epoxy resin may be disposed between the bottom surface of the light sensitive array sensor 504 and the top surface of the interposer 502.

In another aspect of the present invention, the interposer 502 and the various additional circuitry (e.g., amplification circuit, driver circuits 506, digitizer circuits 508, and the like) are disposed on a surface of a substrate 510. In a further aspect, the substrate 510 includes a substrate having high thermal conductivity (e.g., ceramic substrate). In this regard, the substrate 510 is configured to provide physical support to the sensor 504/interposer 502 assembly, while also providing a means for the assembly 500 to efficiently conduct heat away from the imaging sensor 504 and the various other circuitry (e.g., driver circuitry 506, digitizer 508, amplifier, and the like). It is recognized herein that the substrate may include any rigid highly heat conductive substrate material known in the art. For example, the substrate 510 may include, but is not limited to, a ceramic substrate. For instance, the substrate 510 may include, but is not limited to, aluminum nitride.

In another embodiment, the substrate 510 may be configured to provide an interface to a socket or an underlying printed circuit board (PCB). For example, as shown in FIG. 5, the substrate 510 may provide interconnection between the interposer 502 and a socket or a PCB via interconnects 512. Those skilled in the art will recognize that the substrate 510 may be operatively coupled to an underlying PCB and further electrically coupled to a socket or PCB in a variety of ways, all of which are interpreted to be within the scope of the present invention.

The various embodiments of the structures and methods of this invention that are described above are illustrative only of the principles of this invention and are not intended to limit the scope of the invention to the particular embodiments described. For example, additional steps may be added to the flow chart depicted in FIGS. 2 and 3, or some of the steps shown may be done in different sequence than shown. Thus, the invention is limited only by the following claims and their equivalents.

The invention claimed is:

1. An image sensor for sensing at least one of deep ultraviolet (DUV) radiation, vacuum ultraviolet (VUV) radiation, extreme ultraviolet (EUV) radiation and charged particles, the image sensor comprising:
   a semiconductor membrane including circuit elements formed on a first surface of the semiconductor membrane and first metal interconnects formed over the circuit elements;
   a pure boron layer formed on a second surface of the semiconductor membrane; and
   a protection layer formed over the circuit elements such that the first metal interconnects are entirely disposed between the semiconductor membrane and said protection layer,
   wherein the semiconductor membrane includes a boron-doped region extending from second surface into the semiconductor membrane such that the boron-doped region is disposed immediately adjacent to the pure boron layer,
   wherein the first metal interconnects comprise a refractory metal,
   wherein the protection layer comprises one or more of monocrystalline silicon and glass.

2. The image sensor of claim 1, wherein the semiconductor membrane comprises an epitaxial layer having a thickness T1 in the range of 10 µm to 40 µm.

3. The image sensor of claim 1, wherein the pure boron layer has a thickness T2 in the range of 2 nm to 20 nm.

4. The image sensor of claim 1, the image sensor further comprising an anti-reflection coating deposited on an outward-facing surface of the pure boron layer.

5. The image sensor of claim 1, wherein the first metal interconnects comprise at least one of tungsten and molybdenum.

6. An image sensor for sensing at least one of deep ultraviolet (DUV) radiation, vacuum ultraviolet (VUV) radiation, extreme ultraviolet (EUV) radiation and charged particles, the image sensor comprising:
   a semiconductor membrane including circuit elements formed on a first surface of the semiconductor membrane, first metal interconnects formed over the circuit elements, and second metal interconnects disposed above the first metal interconnects and being coupled to the circuit elements; and
   a pure boron layer formed on a second surface of the semiconductor membrane,
   wherein the first metal interconnects comprise a refractory metal, and
   wherein the second metal interconnects comprise at least one of aluminum and copper.

7. The image sensor of claim 3, wherein the image sensor comprises one of a charge-coupled device (CCD) and a CMOS device.

8. An image sensor for sensing at least one of deep ultraviolet (DUV) radiation, vacuum ultraviolet (VUV) radiation, extreme ultraviolet (EUV) radiation and charged particles, the image sensor comprising:

a semiconductor membrane having a first p-type doping concentration and including circuit elements formed on a first surface thereof;
first metal interconnects connected to at least one of said circuit elements, the first metal interconnects comprising a refractory metal;
second metal interconnects disposed above the first metal interconnects and coupled to the circuit elements;
a pure boron layer formed on a second surface of the semiconductor membrane; and
a p-doped layer formed in the semiconductor membrane immediately adjacent to the pure boron layer, said p-doped layer having a second p-type doping concentration that is greater than said first p-type doping concentration,
wherein the second metal interconnects comprise at least one of aluminum and copper.

9. The image sensor of claim 8,
wherein a thickness of the pure boron layer is between 2 nm and 20 nm, and
wherein a thickness of the semiconductor membrane is between 10 μm and 40 μm.

10. The image sensor of claim 9, the image sensor further comprising an anti-reflection or protective layer, and
wherein the thickness of the pure boron layer is between 3 nm and 10 nm.

11. The image sensor of claim 9, wherein the first metal interconnects comprise at least one of tungsten and molybdenum.

12. The image sensor of claim 6, wherein the semiconductor membrane comprises an epitaxial layer having a thickness T1 in the range of 10 μm to 40 μm.

13. The image sensor of claim 6, wherein the pure boron layer has a thickness T2 in the range of 2 nm to 20 nm.

14. The image sensor of claim 6, the image sensor further comprising an anti-reflection coating deposited on an outward-facing surface of the pure boron layer.

15. The image sensor of claim 6, further comprising a protection layer formed over the circuit elements such that the first metal interconnects are entirely disposed between the semiconductor membrane and said protection layer.

16. The image sensor of claim 15, wherein the protection layer comprises one or more of monocrystalline silicon and glass.

17. The image sensor of claim 6, wherein the first metal interconnects comprise at least one of tungsten and molybdenum.

18. The image sensor of claim 6, wherein the image sensor comprises one of a charge-coupled device (CCD) and a CMOS device.

* * * * *